US009316677B2

(12) United States Patent
Grunthaner et al.

(10) Patent No.: US 9,316,677 B2
(45) Date of Patent: Apr. 19, 2016

(54) DEVICES AND METHODS FOR TESTING FLEX CABLE SHIELDING

(75) Inventors: Martin P. Grunthaner, Mountain View, CA (US); Jean-Marie Bussat, Mountain View, CA (US); Benjamin B. Lyon, Saratoga, CA (US); Steven P. Hotelling, Los Gatos, CA (US); Albert Lin, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 739 days.

(21) Appl. No.: 13/484,095

(22) Filed: May 30, 2012

(65) Prior Publication Data

US 2013/0221988 A1 Aug. 29, 2013

Related U.S. Application Data

(60) Provisional application No. 61/605,007, filed on Feb. 29, 2012.

(51) Int. Cl.
G01R 27/28 (2006.01)
G01R 31/08 (2006.01)
G01R 31/02 (2006.01)
G01R 29/08 (2006.01)
G01R 31/00 (2006.01)

(52) U.S. Cl.
CPC .......... *G01R 31/021* (2013.01); *G01R 29/0835* (2013.01); *G01R 31/001* (2013.01); *Y10T 29/49004* (2015.01)

(58) Field of Classification Search
CPC . G01R 31/021; G01R 31/001; G01R 29/0835

USPC .......... 324/67, 527, 539, 541, 543–544, 551, 324/627, 750.26, 750.3
See application file for complete search history.

(56) References Cited

U.S. PATENT DOCUMENTS

| 4,931,782 | A |   | 6/1990  | Jackson |
|---|---|---|---|---|
| 5,477,152 | A | * | 12/1995 | Hayhurst ...................... 324/542 |
| 5,483,261 | A |   | 1/1996  | Yasutake |
| 5,488,204 | A |   | 1/1996  | Mead et al. |
| 5,825,352 | A |   | 10/1998 | Bisset et al. |
| 5,827,078 | A | * | 10/1998 | Simonian ........................ 439/95 |
| 5,835,079 | A |   | 11/1998 | Shieh |
| 5,880,411 | A |   | 3/1999  | Gillespie et al. |
| 5,886,531 | A | * | 3/1999  | Delcourt et al. ............... 324/627 |
| 6,027,762 | A |   | 2/2000  | Tomita et al. |
| 6,188,391 | B1|   | 2/2001  | Seely et al. |

(Continued)

FOREIGN PATENT DOCUMENTS

EP          0454578 A1   10/1991
JP     2000-163031 A     6/2000

(Continued)

OTHER PUBLICATIONS

Machine translation of applicant-submitted EP0454578.*

(Continued)

*Primary Examiner* — Amy He
(74) *Attorney, Agent, or Firm* — Morrison & Foerster LLP

(57) ABSTRACT

Methods and devices for testing flex cable shielding of a consumer electronic device are provided. In one example, a method may include applying a signal across a first portion of the flex cable shielding and a second portion of the flex cable shielding. The method may also include detecting a parameter associated with the signal. The method may include determining a health of the flex cable shielding based at least partially on the detected parameter.

24 Claims, 9 Drawing Sheets

(56) References Cited

U.S. PATENT DOCUMENTS

| | | | |
|---|---|---|---|
| 6,310,610 B1 | 10/2001 | Beaton et al. | |
| 6,323,846 B1 | 11/2001 | Westerman et al. | |
| 6,690,387 B2 | 2/2004 | Zimmerman et al. | |
| 6,710,604 B2 * | 3/2004 | Christopherson et al. | 324/543 |
| 6,937,029 B2 * | 8/2005 | Gambardella | G01R 31/021 324/539 |
| 7,015,894 B2 | 3/2006 | Morohoshi | |
| 7,184,064 B2 | 2/2007 | Zimmerman et al. | |
| 7,663,607 B2 | 2/2010 | Hotelling et al. | |
| 7,775,833 B1 * | 8/2010 | Le et al. | 439/620.08 |
| 7,804,784 B1 * | 9/2010 | Lo | 370/251 |
| 8,039,748 B2 * | 10/2011 | Koga | 174/110 R |
| 8,479,122 B2 | 7/2013 | Hotelling et al. | |
| 2004/0183787 A1 | 9/2004 | Geaghan et al. | |
| 2006/0160421 A1 * | 7/2006 | Dangler | H05K 1/0218 439/607.01 |
| 2006/0197753 A1 | 9/2006 | Hotelling | |
| 2008/0236868 A1 | 10/2008 | Koga | |
| 2008/0236905 A1 | 10/2008 | Endo et al. | |
| 2009/0283300 A1 * | 11/2009 | Grunthaner | 174/254 |
| 2009/0294022 A1 | 12/2009 | Hayes et al. | |

FOREIGN PATENT DOCUMENTS

| | | |
|---|---|---|
| JP | 2002-342033 A | 11/2002 |
| KR | 20-0451134 Y1 | 11/2010 |

OTHER PUBLICATIONS

Wang et al.; "Electromagnetic shielding analysis of printed flexible meshed screens," 2010 Asia-Pacific Symposium on Electromagnetic Compatibility (APEMC), IEEE, Piscataway, NJ, USA, Apr. 12, 2010, pp. 965-968 (XP031683125).

Extended European Search Report for EP Application 13156929.5 dated Jun. 13, 2013, 7 pgs.

European Search Report for EP Application 13156929.5 dated Aug. 7, 2013, four pages.

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

\* cited by examiner

DEVICES AND METHODS FOR TESTING FLEX CABLE SHIELDING

CROSS REFERENCE TO RELATED APPLICATIONS

This application is a Non-Provisional Patent Application of U.S. Provisional Patent Application No. 61/605,007, entitled "Devices and Methods for Testing Flex Cable Shielding", filed Feb. 29, 2012, which is herein incorporated by reference.

BACKGROUND

The present disclosure relates generally to flex cables and, more particularly, to flex cables having a shielding material surrounding signal carrying conductors of the flex cables to protect the signals from electromagnetic interference (EMI) and/or capacitive loading effects.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Flat panel displays, such as liquid crystal displays (LCDs) and organic light emitting diode (OLED) displays are commonly used in a wide variety of electronic devices, including such consumer electronics as televisions, computers, and handheld devices (e.g., cellular telephones, audio and video players, gaming systems, and so forth). Such display panels typically provide a flat display in a relatively thin package that is suitable for use in a variety of electronic goods.

A flat panel display may include a touch screen for providing input to an electronic device. Furthermore, the touch screen may include multiple layers coupled together via a flex cable. The flex cable may provide signal carrying conductors to transfer signals from the multiple layers of the touch screen. To protect the signal carrying conductors from electromagnetic interference (EMI) and/or capacitive loading effects, such as from an enclosure of the electronic device, the signal carrying conductors may include a shielding layer that surrounds the signal carrying conductors. If the shielding layer develops cracks or microfractures, the signal carrying conductors may not be properly shielded from the EMI and/or the capacitive loading effects, resulting in improper operation of the electronic device.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the present disclosure relate to devices and methods for testing flex cable shielding of flex cables for defects, such as cracks or microfractures, to enable a consumer electronic device using the flex cable to function properly. By way of example, a method for testing flex cable shielding of a consumer electronic device may include applying a signal across a first portion of the flex cable shielding and a second portion of the flex cable shielding, detecting a parameter associated with the signal, and determining a health of the flex cable shielding based at least partially on the detected parameter.

Various refinements of the features noted above may be made in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

Figure 1:
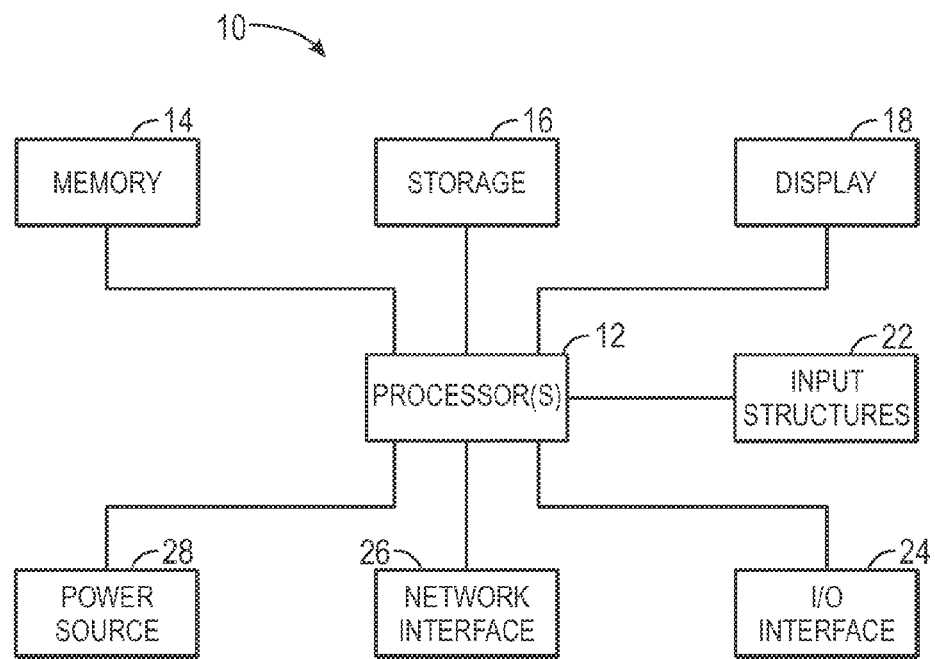
FIG. 1 is a schematic block diagram of an electronic device with a flex cable having flex cable shielding to protect signal carrying conductors of the flex cable, in accordance with an embodiment.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

As mentioned above, embodiments of the present disclosure relate to electronic devices incorporating flex cables, such as flex cables that are coupled to multiple layers of a touch screen. Specifically, the flex cables include a shielding to protect signal carrying conductors of the flex cables from electromagnetic interference (EMI) and/or capacitive loading effects. If defects, such as cracks, breaks, or microfractures occur, the shielding may not function properly. Accordingly, a touch panel (or touch screen) using a flex cable having shielding defects may have undesirable or catastrophic behavior. For example, the touch panel may display touches occurring on the touch panel when the touch panel has not been touched, the touch panel may display touches occurring at a first location on the touch panel where a user touched the touch panel at a second location where a user did not touch the touch panel, the touch panel may not display any touches that have occurred, the touch panel may display multiple touches as having occurred where only one touch occurred, and so forth.

To detect defects in flex cable shielding, and thereby reduce the undesirable results that may occur if defects exist in the flex cable shielding, the flex cable shielding may be tested by applying a signal (e.g., a fixed current or voltage) across a first portion of the flex cable shielding and a second portion of the flex cable shielding. A parameter (e.g., a voltage, a current, or a resistance) associated with the applied signal may be detected. Using the detected parameter, a health of the flex cable shielding may be determined. For example, detected parameter may indicate that the flex cable shielding does not contain any defects, contains minor defects, contains major defects, and so forth. Accordingly, defects in the flex cable shielding may be detected and appropriate corrective action may be taken to inhibit defective flex cable shielding from impacting the operation of an electronic device.

Figure 2:
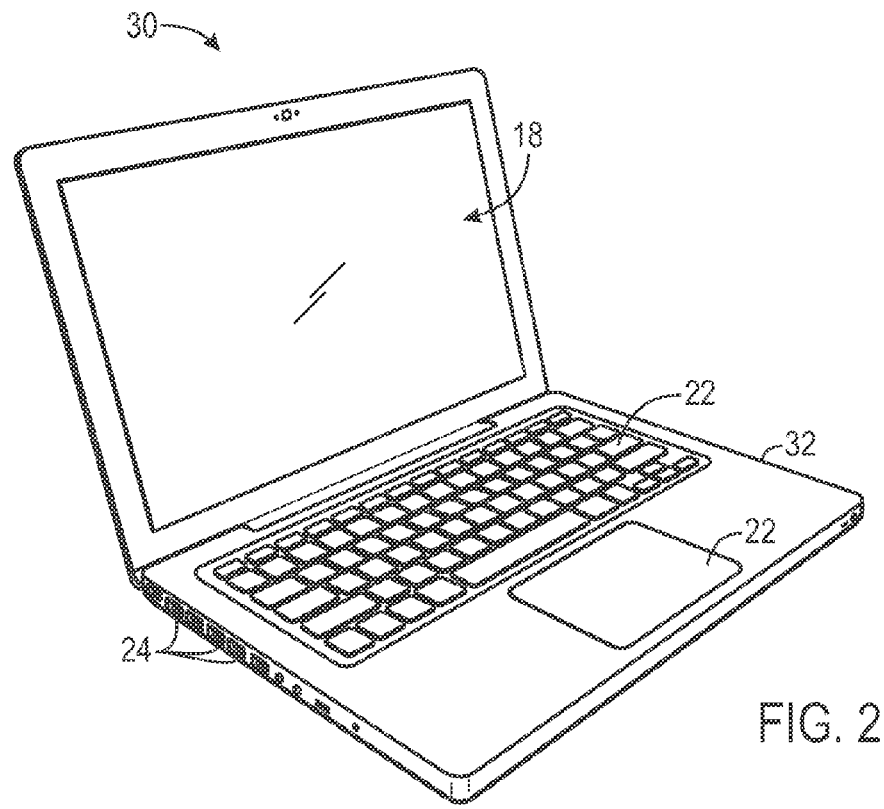
FIG. 2 is a perspective view of a notebook computer representing an embodiment of the electronic device of FIG. 1.
Figure 3:
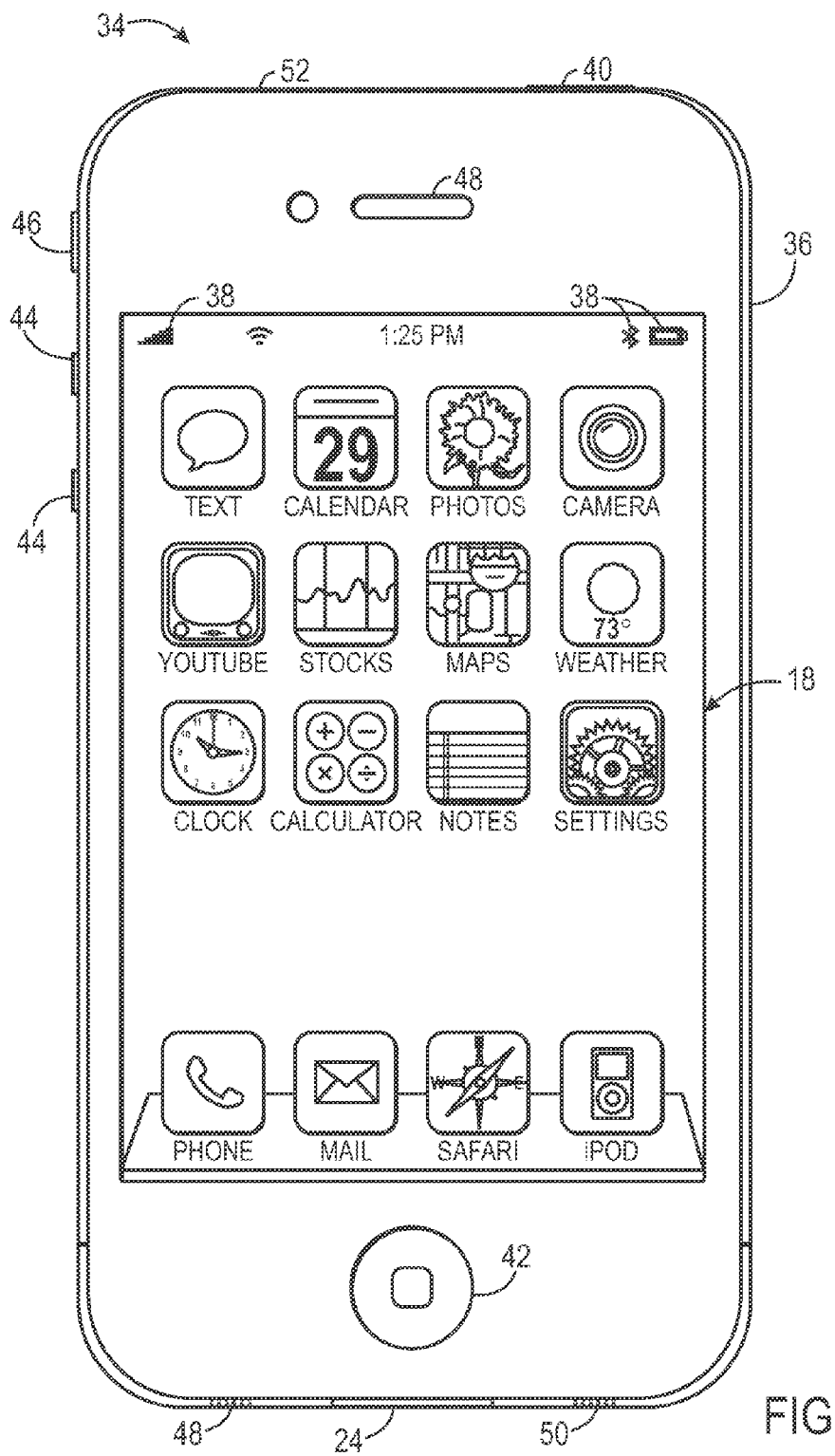
FIG. 3 is a front view of a handheld device representing another embodiment of the electronic device of FIG. 1.

With the foregoing in mind, a general description of suitable electronic devices that may employ flex cables having flex cable shielding will be provided below. In particular, FIG. 1 is a block diagram depicting various components that may be present in an electronic device suitable for incorporating flex cables. FIGS. 2 and 3 respectively illustrate perspective and front views of a suitable electronic device, which may be, as illustrated, a notebook computer or a handheld electronic device.

Turning first to FIG. 1, an electronic device 10 according to an embodiment of the present disclosure may include, among other things, one or more processor(s) 12, memory 14, nonvolatile storage 16, a display 18, input structures 22, an input/output (I/O) interface 24, network interfaces 26, and a power source 28. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in the electronic device 10. As will be appreciated, any portion of the electronic device 10 may include flex cables to route signal carrying conductors. Furthermore, when defects exist in flex cable shielding, the electronic device 10 may not function properly. As such, embodiments of the present disclosure may be employed to detect defects in flex cable shielding.

By way of example, the electronic device 10 may represent a block diagram of the notebook computer depicted in FIG. 2, the handheld device depicted in FIG. 3, or similar devices. It should be noted that the processor(s) 12 and/or other data processing circuitry may be generally referred to herein as "data processing circuitry." This data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

As presented herein, the data processing circuitry may control the electronic display 18. In addition, the data processing circuitry may apply a signal (e.g., a current or voltage) across a first portion (e.g., a first pin or first location) of the flex cable shielding and a second portion (e.g., a second pin or second location) of the flex cable shielding, detect a parameter (e.g., a resistance, current, or voltage) associated with the signal, and determine the health (e.g., whether defects exist) of the flex cable shielding based on the detected parameter. By determining the health of the flex cable shielding, defects in the flex cable shielding may be detected and resolved.

In the electronic device 10 of FIG. 1, the processor(s) 12 and/or other data processing circuitry may be operably coupled with the memory 14 and the nonvolatile memory 16 to execute instructions. Such programs or instructions executed by the processor(s) 12 may be stored in any suitable article of manufacture that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs (e.g., for storing health data related to flex cable shielding, such as for performing diagnostics on the electronic device 10). Also, programs (e.g., an operating system) encoded on such a computer program product may also include instructions that may be executed by the processor(s) 12.

The display 18 may be a touch-screen liquid crystal display (LCD), for example, which may enable users to interact with a user interface of the electronic device 10. In some embodiments, the electronic display 18 may be a MultiTouch™ display that can detect multiple touches at once. The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interfaces 26 (e.g., to transmit determined health of flex cable shielding to an external diagnostics device). The network interfaces 26 may include, for example, interfaces for a personal area network (PAN), such as a Bluetooth network, for a local area network (LAN), such as an 802.11x Wi-Fi network, and/or for a wide area network (WAN), such as a 3G or 4G cellular network. The power source 28 of the electronic device 10 may be any suitable source of power, such as a rechargeable lithium polymer (Li-poly) battery and/or an alternating current (AC) power converter.

The electronic device 10 may take the form of a computer or other type of electronic device. Such computers may include computers that are generally portable (such as laptop, notebook, and tablet computers) as well as computers that are generally used in one place (such as conventional desktop computers, workstations and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of a notebook computer 30, is illustrated in FIG. 2 in accordance with one embodiment of the present disclosure. The depicted computer 30 may include a housing 32, a display 18, input structures 22, and ports of an I/O interface 24. In one embodiment, the input structures 22 (such as a keyboard and/or touchpad) may be used to interact with the computer 30, such as to start, control, or operate a GUI or applications running on computer 30. For example, a keyboard and/or touchpad may allow a user to navigate a user interface or application interface displayed on the display 18. Further, the computer 30 may include flex cables having flex cable shielding that may be tested for defects using the methods described in detail below.

FIG. 3 depicts a front view of a handheld device 34, which represents one embodiment of the electronic device 10. The handheld device 34 may represent, for example, a portable phone, a media player, a personal data organizer, a handheld game platform, or any combination of such devices. By way of example, the handheld device 34 may be a model of an iPod® or iPhone® available from Apple Inc. of Cupertino, Calif. In other embodiments, the handheld device 34 may be a tablet-sized embodiment of the electronic device 10, which may be, for example, a model of an iPad® available from Apple Inc.

The handheld device 34 may include an enclosure 36 to protect interior components from physical damage and to shield them from electromagnetic interference. The enclosure 36 may surround the display 18, which may display indicator icons 38. The indicator icons 38 may indicate, among other things, a cellular signal strength, Bluetooth connection, and/or battery life. The I/O interfaces 24 may open through the enclosure 36 and may include, for example, a proprietary I/O port from Apple Inc. to connect to external devices.

User input structures 40, 42, 44, and 46, in combination with the display 18, may allow a user to control the handheld device 34. For example, the input structure 40 may activate or deactivate the handheld device 34, the input structure 42 may navigate a user interface to a home screen, a user-configurable application screen, and/or activate a voice-recognition feature of the handheld device 34, the input structures 44 may provide volume control, and the input structure 46 may toggle between vibrate and ring modes. A microphone 48 may obtain a user's voice for various voice-related features, and a speaker 50 may enable audio playback and/or certain phone capabilities. A headphone input 52 may provide a connection to external speakers and/or headphones. As mentioned above, the handheld device 34 may include flex cables having flex cable shielding that may be tested for defects using the methods described in detail below.

Figure 4:
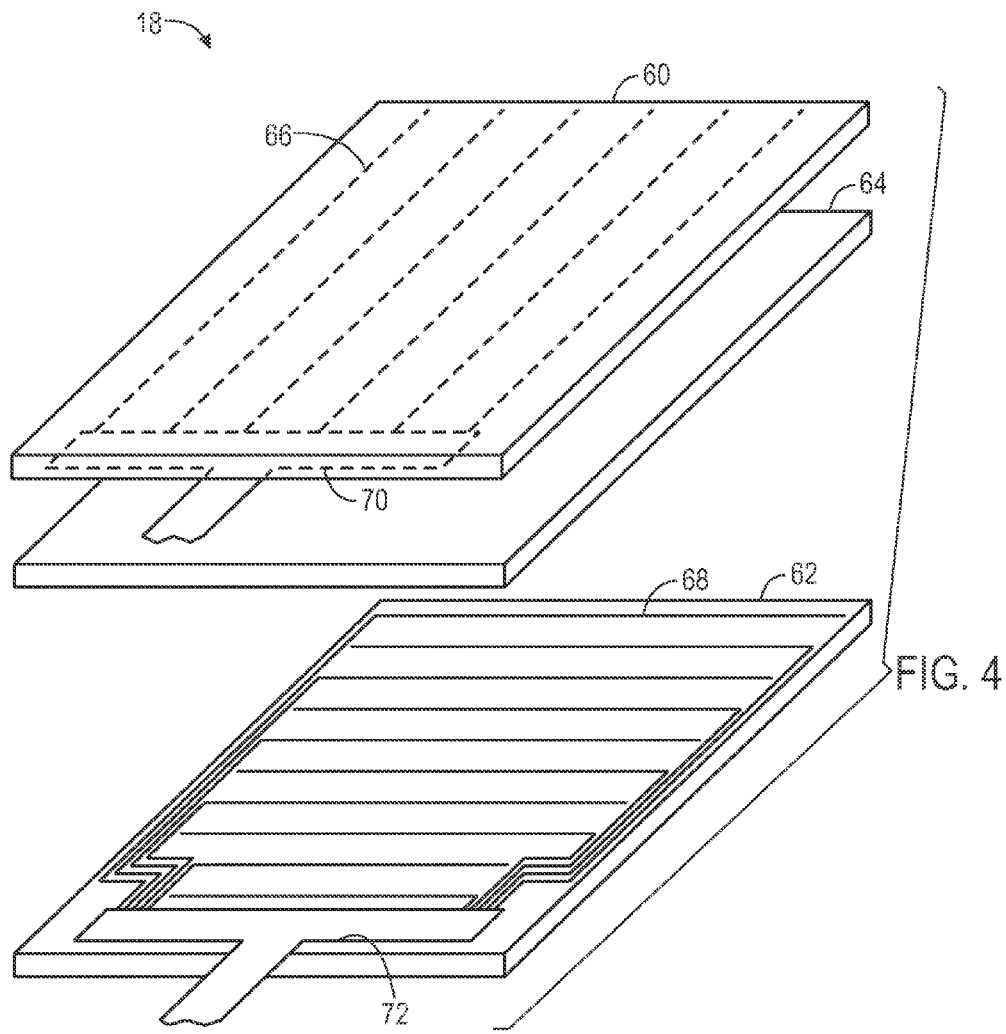
FIG. 4 is a perspective view of layers of a touch panel coupled together with a flex cable having flex cable shielding to protect signal carrying conductors of the flex cable, in accordance with an embodiment.

Flex cables may be used within the electronic device 10 to couple any portion of the electronic device 10 together. For example, FIG. 4 illustrates layers of a touch panel of the display 18. Specifically, the display 18 includes a top glass layer 60, a bottom glass layer 62, and a dielectric layer 64 disposed between the top glass layer 60 and the bottom glass layer 62. The top glass layer 60 may include transparent column traces 66 etched into the top glass layer 60. The column traces 66 are used to detect a column of the top glass layer 60 where touches occur. Furthermore, the bottom glass layer 62 may include transparent row traces 68 etched into the bottom glass layer 62. The row traces 68 are used to detect a row of the bottom glass layer 62 where touches occur. Accordingly, using the column traces 66 and the row traces 68, a location of touches may be determined. The dielectric layer 64, which may be formed from a clear polymer, may be used to isolate the column traces 66 from the row traces 68.

A flex cable may be coupled between the top glass layer 60 and the bottom glass layer 62. Specifically, a connector 70 of the flex cable may be coupled to the top glass layer 60 and a connector 72 of the flex cable may be coupled to the bottom glass layer 62. A body of the flex cable (not shown) may connect the connectors 70 and 72 together. As will be appreciated, the flex cable may include shielding to protect signal carrying conductors of the flex cable from EMI and/or capacitive loading effects.

Figure 5:
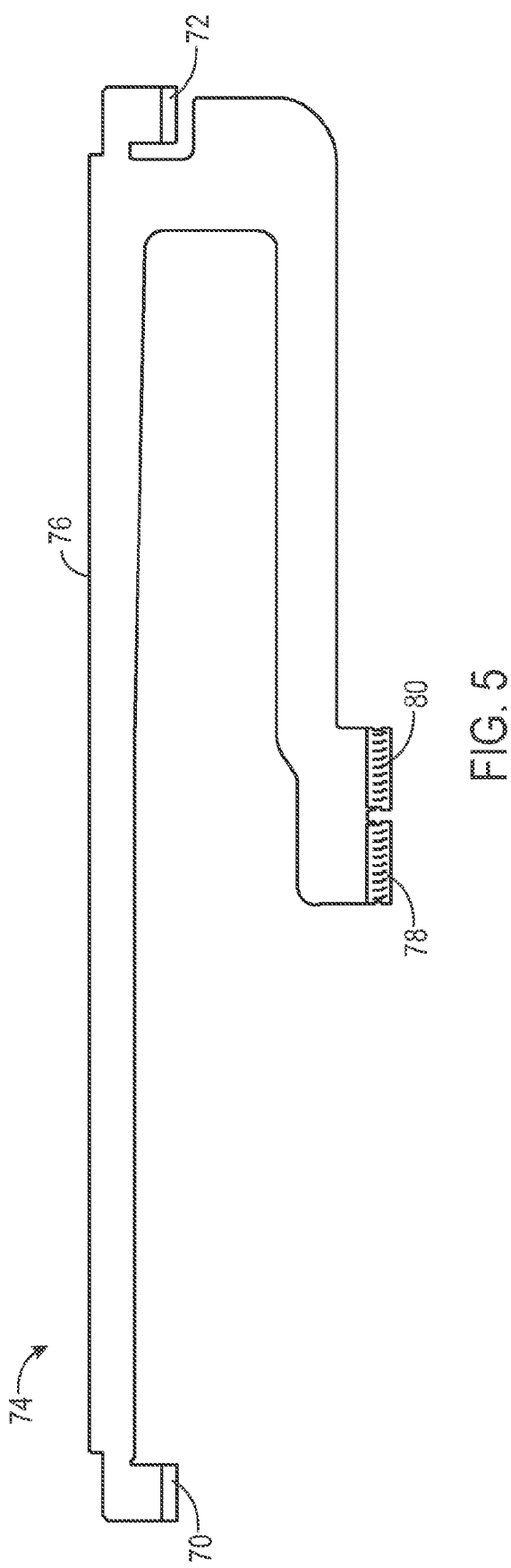
FIG. 5 is a top view of a flex cable having flex cable shielding to protect signal carrying conductors of the flex cable, in accordance with an embodiment.

Flex cables used to connect portions of the electronic device 10 together may be formed in a variety of sizes, shapes, and configurations. FIG. 5 illustrates one embodiment of a flex cable 74 which may include flex cable shielding to protect signal carrying conductors of the flex cable 74. The flex cable 74 includes a body portion 76 having signal carrying conductors extending therein. Furthermore, zero insertion force (ZIF) connectors 70, 72, 78, and 80 are coupled to the body portion 76. The signal carrying conductors are used to transfer signals between the various ZIF connectors 70, 72, 78, and 80 of the flex cable 74. As will be appreciated, the flex cable 74 may include any number of ZIF connectors or other suitable connectors. In addition, the body portion 76 of the flex cable 74 may be configured in any suitable shape.

Figure 6:
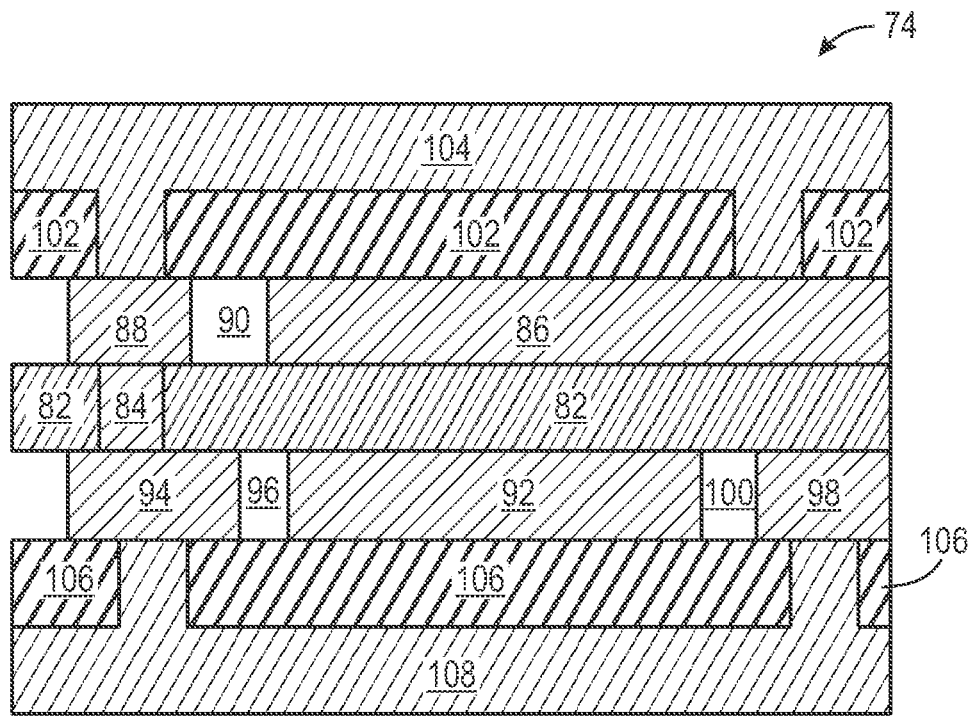
FIG. 6 is a cross-sectional view of a flex cable having flex cable shielding to protect signal carrying conductors of the flex cable, in accordance with an embodiment.

The flex cable 74 may include shielding to protect signal carrying conductors from EMI and/or capacitive loading effects. As such, FIG. 6 illustrates a cross-sectional view of the flex cable 74 having shielding to protect signal carrying conductors. The flex cable 74 includes a flexible printed circuit (FPC) base layer 82. The FPC base layer 82 of the flex cable 74 is generally formed of a non-conductive base material. As illustrated, the flex cable 74 includes an interconnecting portion 84 (e.g., copper trace) disposed between sections of the FPC base layer 82 and is used to provide a conductive path between the layers that surround the FPC base layer 82, as will be explained in detail below.

On the top side of the FPC base layer 82, a first set of conductive traces 86 (e.g., copper traces or signal carrying conductors) are formed to carry signals between connectors of the flex cable 74. The conductive traces 86 are separated from a first conductive island 88 (e.g., copper island) via a first insulative spacer 90. As illustrated, the first conductive island 88 directly contacts, and provides a conductive pathway with, the interconnecting portion 84.

On the bottom side of the FPC base layer 82, a second set of conductive traces 92 (e.g., copper traces or signal carrying conductors) are formed to carry signals between connectors of the flex cable 74. The conductive traces 92 are separated from a second conductive island 94 (e.g., copper island) via a second insulative spacer 96. As illustrated, the second conductive island 94 directly contacts, and provides a conductive pathway with, the interconnecting portion 84. A third conductive island 98 is separated from the conductive traces 92 via a third insulative spacer 100. In certain embodiments, the third conductive island 98 may be coupled to a pin of one of the flex cable connectors. The pin may be used for testing the flex cable shielding for defects.

Returning to the top side of the FPC base layer 82, above the conductive traces 86 is an insulator 102 (or coverlay). The insulator 102 generally isolates a top shielding layer 104 from the conductive traces 86. However, as illustrated, a portion of the top shielding layer 104 contacts the conductive traces 86 and a portion of the top shielding layer 104 contacts the first conductive island 88. To enable maximum test coverage, the portion of the top shielding layer 104 that contacts the conductive traces 86 and the portion of the top shielding layer 104 that contacts the first conductive island 88 may be configured to be at opposite ends of the flex cable 74. On the bottom side of the FPC base layer 82, below the conductive traces 92 is an insulator 106 (or coverlay). The insulator 106 generally isolates a bottom shielding layer 108 from the conductive traces 92. Further, as illustrated, a portion of the bottom shielding layer 108 contacts the second conductive island 94 and a portion of the bottom shielding layer 108 contacts the third conductive island 98. Although a two-layer flex cable 74 is illustrated, the flex cable 74 may be one-layer, two-layers, or more than two layers (e.g., multi-layered). It should be noted that the top shielding layer 104 and the bottom shielding layer 108 may be formed from a shield film manufactured by Tatsuta Electric Wire & Cable Co., Ltd. of Osaka, Japan. For example, the shield film may be formed from part number SF-PC5600 or SF-PC5900 manufactured by Tatsuta Electric Wire & Cable Co., Ltd. As will be appreciated, with the top shielding layer 104 and the bottom shielding layer 108, the conductive traces 86 and 92 may be shielded from EMI and/or capacitive loading effects.

Figure 7:
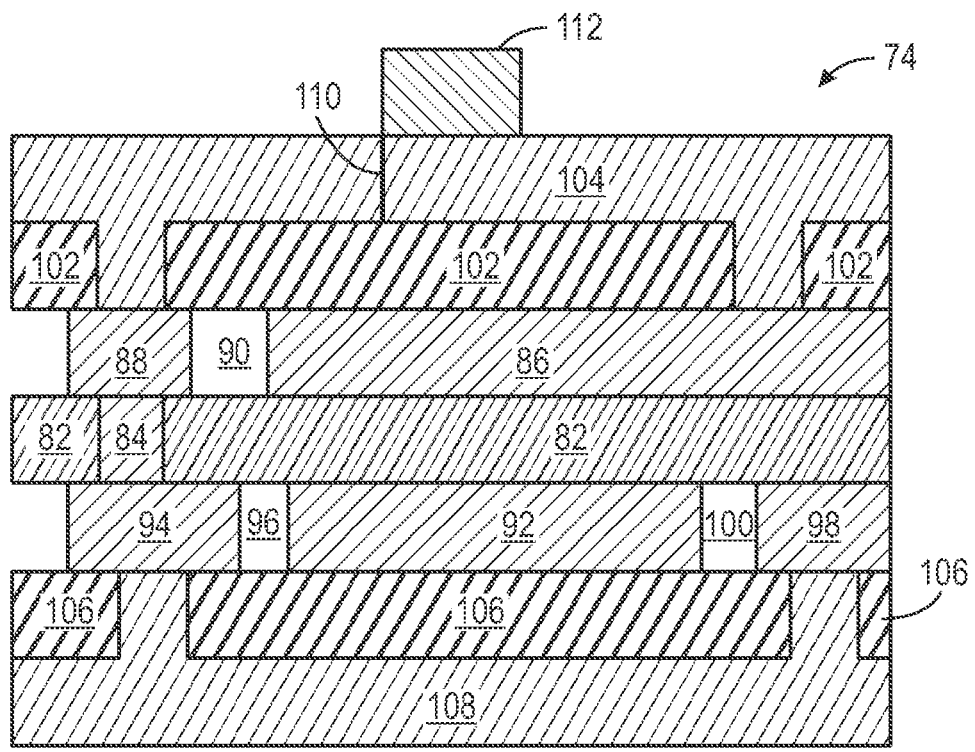
FIG. 7 is a cross-sectional view of the flex cable of FIG. 6 having a complete break in the flex cable shielding of the flex cable, in accordance with an embodiment.
Figure 8:
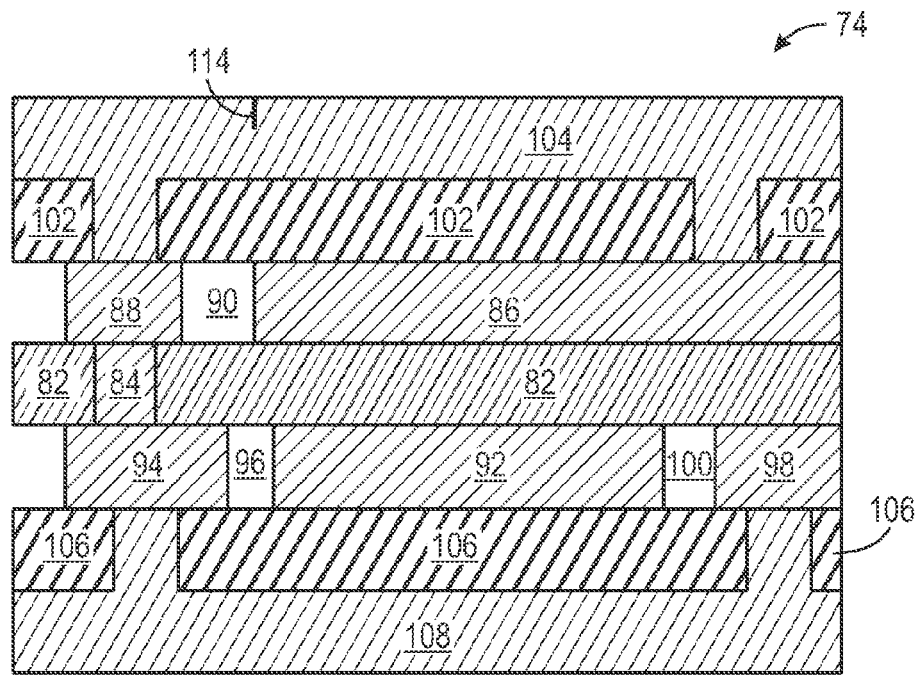
FIG. 8 is a cross-sectional view of the flex cable of FIG. 6 having a partial break in the flex cable shielding of the flex cable, in accordance with an embodiment.

Defects in the shielding of the flex cable 74 may inhibit the shielding from functioning properly. For example, FIG. 7 illustrates a complete break 110 (e.g., a break that extends completely through the shielding) in the top shielding layer 104 of the flex cable 74. As will be appreciated, the complete break 110 may occur due to stress from manufacturing, usage, or a stiffener 112 attached to the top shielding layer 104, for example. As another example, FIG. 8 illustrates a partial break 114 (e.g., a break that extends partially through the shielding) in the top shielding layer 104 of the flex cable 74. Again, the partial break 114 may occur due to stress from manufacturing, usage, or a stiffener.

The health of the top shielding layer 104 and the bottom shielding layer 108 may be tested by applying a signal across the conductive traces 86 and the third conductive island 98.

Figure 9:
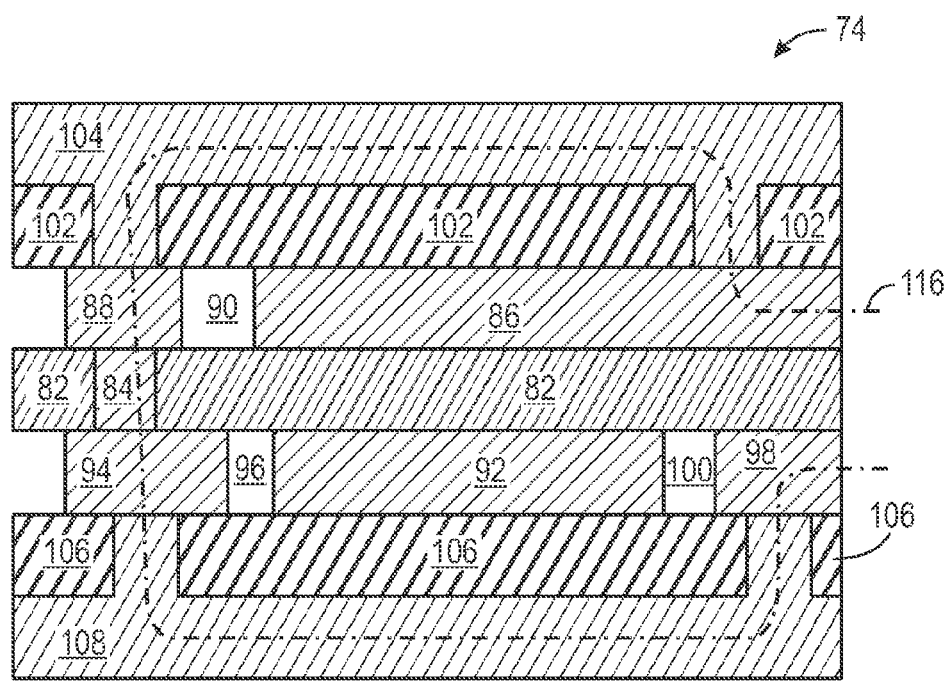
FIG. 9 is a cross-sectional view of the flex cable of FIG. 6 illustrating a conductive path that may be used for testing the flex cable shielding of the flex cable, in accordance with an embodiment.

FIG. 9 illustrates a conductive path 116 for testing the health of the flex cable shielding of the flex cable 74. As illustrated, the conductive path 116 (e.g., a shield loop) is formed by contact between the following conductors: the conductive traces 86, the top shielding layer 104, the first conductive island 88, the interconnecting portion 84, the second conductive island 94, the bottom shielding layer 108, and the third conductive island 98.

As will be appreciated, the health of the top shielding layer 104 and the bottom shielding layer 108 may be determined in a variety of ways. For example, the health of the top shielding layer 104 and the bottom shielding layer 108 may be determined by applying a fixed voltage across the conductive traces 86 and the third conductive island 98 and detecting a current flowing through the conductive path 116. Accordingly, a current of zero (e.g., open circuit) may indicate that there is a complete break in the flex cable shielding, such as a break similar to the complete break 110 of FIG. 7. As another example, the health of the top shielding layer 104 and the bottom shielding layer 108 may be determined by applying a fixed current across the conductive traces 86 and the third conductive island 98 and detecting a voltage across the conductive traces 86 and the third conductive island 98. The detected voltage may be used to determine the resistance of the conductive path 116. Using the resistance of the conductive path 116, it may be determined whether a complete break in the flex cable shielding has occurred (e.g., a very high resistance or open circuit resistance may be determined or measured), such as a break similar to the complete break 110 of FIG. 7. It may also be determined whether a partial break in the flex cable shielding has occurred (e.g., a resistance that is outside of an expected resistance), such as a break similar to the partial break 114 of FIG. 8. As will be appreciated, in some embodiments, the conductive traces 86 may be coupled to ground, while the third conductive island 98 may be coupled to a pin, such as a test pin. In other embodiments, the conductive traces 86 and the third conductive island 98 may each be coupled to a pin. Such pins may be spare pins, dedicated pins, ground pins, test pins, and so forth.

Figure 10:
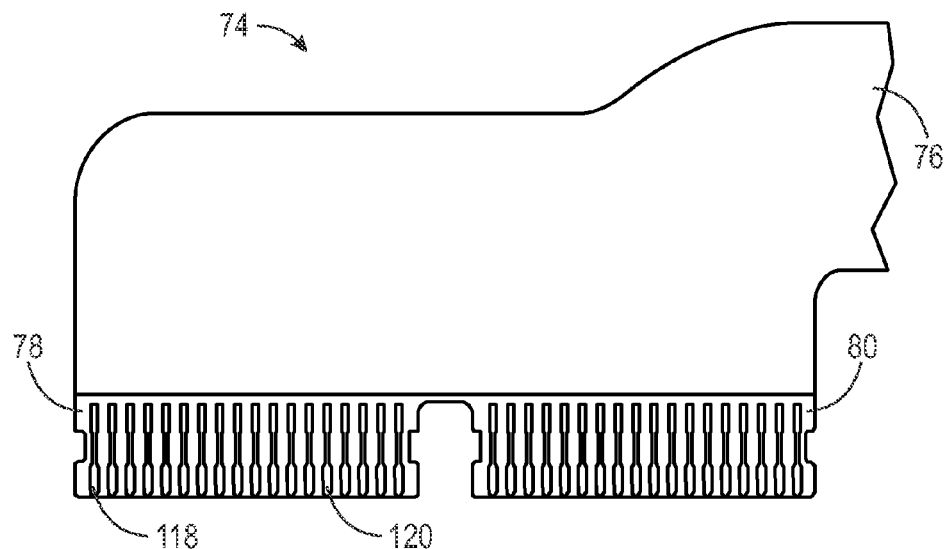
FIG. 10 is a top view of connectors of a flex cable having pins for testing flex cable shielding of the flex cable, in accordance with an embodiment.

In certain embodiments, a signal may be applied across the conductive traces 86 and the third conductive island 98 using pins of a connector of the flex cable 74. As such, FIG. 10 illustrates the flex cable 74 having pins 118 and 120 on the connector 78 for testing the flex cable shielding of the flex cable 74. For example, the conductive traces 86 (which may be coupled to ground) may be coupled to the pin 118, and the third conductive island 98 may be coupled to the pin 120. Accordingly, the health of the shielding of the flex cable 74 may be determined by applying signals across the pins 118 and 120.

Figure 11:
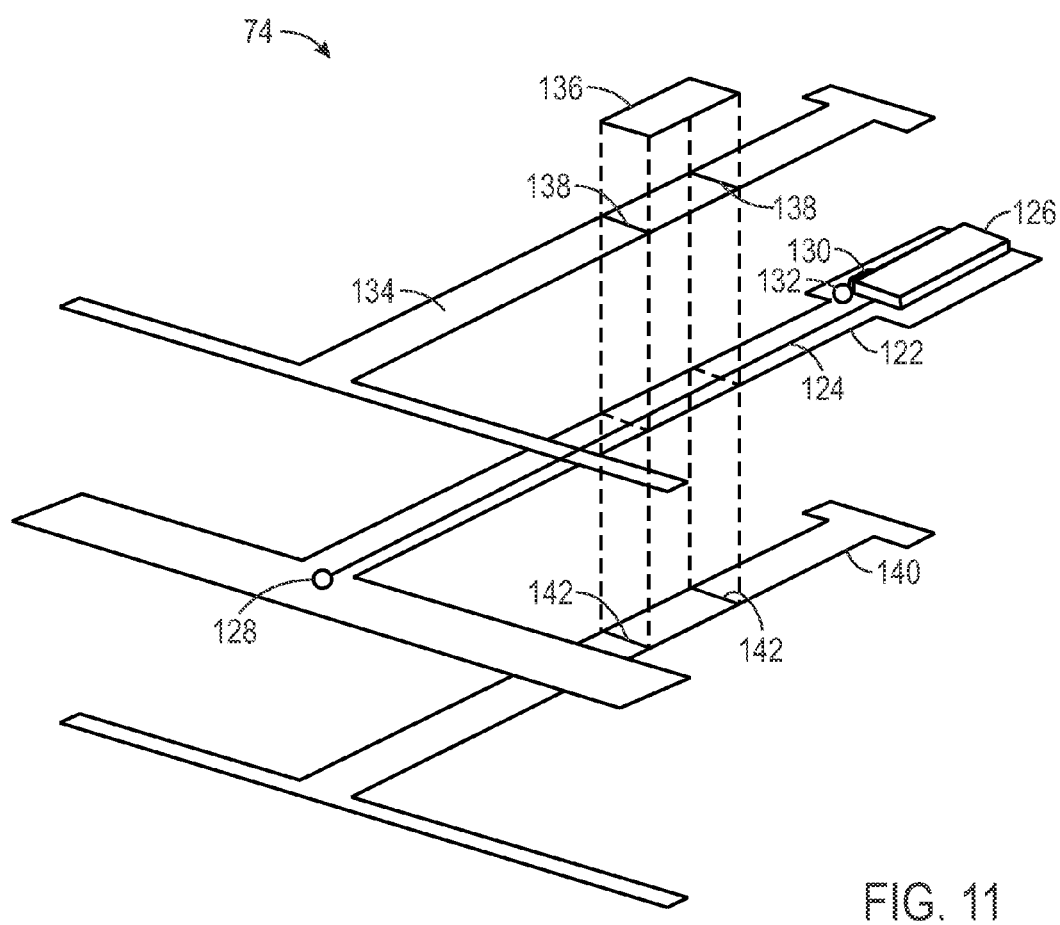
FIG. 11 is a perspective view of layers of a flex cable having multiple traces for testing flex cable shielding of the flex cable, in accordance with an embodiment.

A flex cable 74 may be arranged so that the health of only a portion of the flex cable shielding may be determined. For example, FIG. 11 is a perspective view of layers of the flex cable 74 having multiple traces for testing flex cable shielding. Specifically, the flex cable 74 may include a base layer 122. The base layer 122 may have multiple individual traces formed thereon. A first trace 124 may electrically couple a first pin of a connector 126 to a first shield contact point 128. Further, a second trace 130 may electrically couple a second pin of the connector 126 to a second shield contact point 132. Accordingly, a top shielding layer 134 may be disposed over the base layer 122 such that the top shielding layer 134 makes contact with the first shield contact point 128 and the second shield contact point 132.

With such a configuration, a signal may be applied across the first and second pins of the connector 126. The signal may be used to determine the continuity and/or resistance between the first and second pins of the connector 126. Specifically, the continuity path may be as follows: from the first pin of the connector 126 along the first trace 124 to the first shield contact point 128, from the first shield contact point 128 to the top shielding layer 134, along the top shielding layer 134 to the second shield contact point 132, and from the second shield contact point 132 along the second trace 130 to the second pin of the connector 126. Accordingly, there should be continuity between the first and second pins of the connector 126 as long as there are not any complete breaks in the top shielding layer 134, or elsewhere in the electric path.

In certain embodiments, a stiffener 136 may be coupled to the top shielding layer 134. The stiffener 136 may weaken the top shielding layer 134 at locations 138 resulting in areas that have an increased risk of breakage. In addition, a bottom shielding layer 140 may be weakened at locations 142 due to the stiffener 136. As will be appreciated, traces may be formed on the opposite side of the base layer 122 to test the continuity and/or resistance of the bottom shielding layer 140. It should be noted that the shield contact points may be positioned at any location along the top shielding layer 134 and/or the bottom shielding layer 140. Using such shield contact points, the continuity and/or resistance between the shield contact points may be determined. For example, the first shield contact point 128 may be on one side of the locations 138, while the second shield contact point 132 may be on an opposite side of the locations 138. Accordingly, a full break at either of the locations 138 may be detected. In another example, the first shield contact point 128 may be between the two locations 138, while the second shield contact point 132 may be on either side of the locations 138. Accordingly, only a full break of the location 138 between the first and second shield contact points 128 and 132 may be detected.

Figure 12:
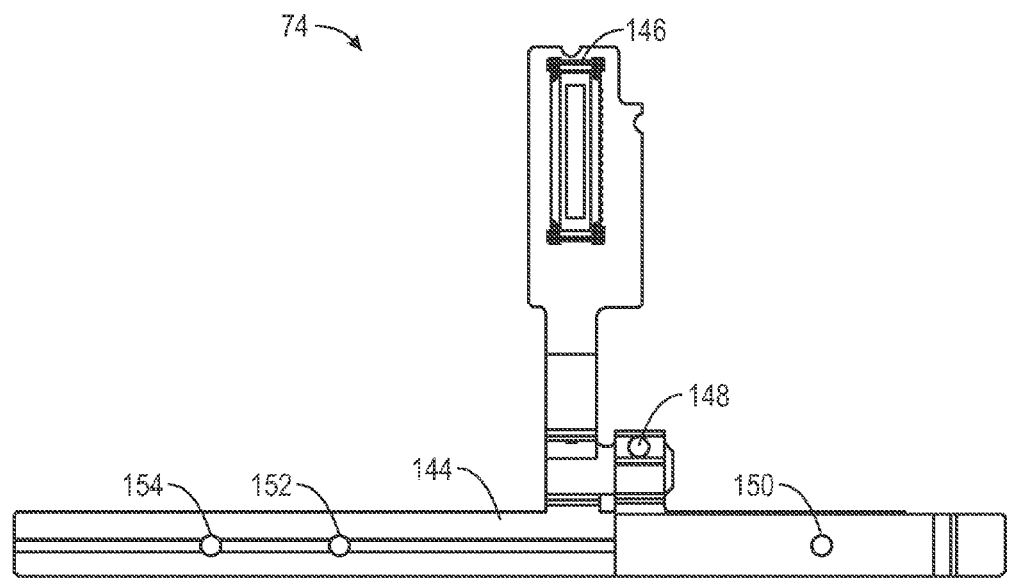
FIG. 12 is a top view of a flex cable having multiple test points for testing flex cable shielding of the flex cable, in accordance with an embodiment.

As will be appreciated, in certain embodiment, the continuity between specific positions of the flex cable shielding may be detected by using test points directly on the cable shielding. As such, any two points on the shielding may have a signal applied thereto in order to determine the continuity and/or resistance between the two points. However, in certain embodiments, the shielding may have an ink layer applied over the shielding. In such embodiments, the ink layer may be removed at the desired locations where the shielding is to be tested. Accordingly, FIG. 12 is a top view of an embodiment of the flex cable 74 having multiple test points for testing flex cable shielding. The flex cable 74 includes a body portion 144 and a connector 146. In certain configurations, the connector 146 backshell or anchors may be coupled to ground. Therefore, a grounded point on the connector 146 may be one test location for testing the cable shielding. Furthermore, the ink may be removed from the surface of the flex cable 74 at any desired location.

With the ink removed, the flex cable shielding is exposed and may be used as a test location. For example, the ink may be removed at one or more of the following locations 148, 150, 152, and/or 154 to result in exposed portions of the flex cable shielding. As such, continuity and/or resistance of the flex cable shielding may be determined between any combination of the grounded portion of the connector 146 and the locations 148, 150, 152, and 154. For example, continuity and/or resistance between locations 152 and 154 may be detected. As another example, continuity and/or resistance between locations 150 and 148 may be detected. As such, the flex cable 74 may be tested to ensure that there are no defects in the flex cable shielding.

Figure 13:
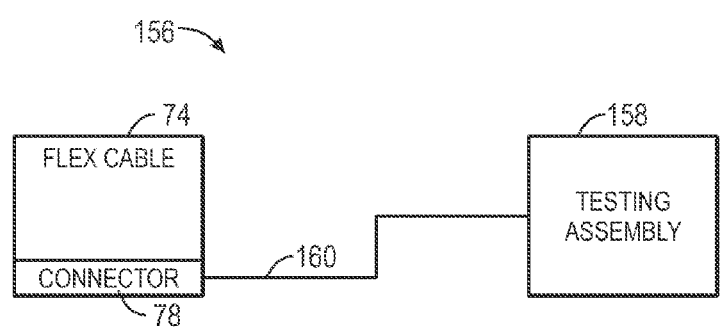
FIG. 13 is schematic block diagram of a test arrangement for testing flex cable shielding of a flex cable using an external testing assembly, in accordance with an embodiment.
Figure 14:
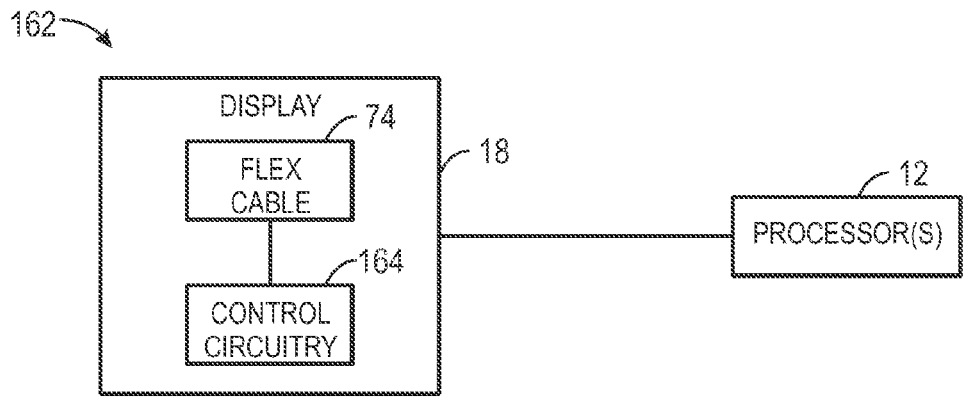
FIG. 14 is a schematic block diagram of a test arrangement for testing flex cable shielding of a flex cable using built in features of a consumer electronic device, in accordance with an embodiment.

The flex cable 74 may be tested using an external test assembly as illustrated in FIG. 13, or a test configuration internal to the electronic device 10 as illustrated in FIG. 14. Specifically, FIG. 13 is schematic block diagram of a test arrangement 156 for testing flex cable shielding of the flex cable 74 using an external testing assembly 158. As illustrated, the external testing assembly 158 may be coupled to the connector 78 of the flex cable 74 using wiring 160. In other embodiments, the external testing assembly 158 may interface directly with the flex cable shielding, or a combination of the flex cable shielding and the connector 78.

The flex cable 74 may be tested using a test configuration internal to the electronic device 10. Accordingly, FIG. 14 is a schematic block diagram of a test arrangement 162 for testing flex cable shielding of the flex cable 74 using built in features of the consumer electronic device 10. Specifically, in certain embodiments, the display 18 may include control circuitry 164 coupled directly to the flex cable 74. At certain predetermined times (e.g., power on, soft power off, hard power off, diagnostics mode, etc.), the control circuitry 164 may apply a signal to the flex cable 74 and detect a parameter associated with the signal. The control circuitry 164 may use the detected parameter to determine a health of the flex cable shielding. In other embodiments, the processor(s) 12 may apply a signal to the flex cable 74 and detect a parameter associated with the signal. The processor(s) 12 may use the detected parameter to determine a health of the flex cable shielding. For example, the processor(s) 12 may be used to determine the health of the flex cable shielding at specific intervals (e.g., during a power on sequence, during a power off sequence, after a hard reset, etc.). As will be appreciated, the control circuitry 164 and/or the processor(s) 12 may be considered a controller.

For example, a shield loop (e.g., conductive path 116) may be terminated with a first pin and a second pin. In one embodiment, the first pin may be coupled to ground. Furthermore, the second pin may be coupled to a general purpose input/output (GPIO) of the electronic device 10 that is configured as an input. During normal operation, the GPIO is not coupled to a pull-up resistor. However, when the electronic device 10 performs a test of the flex cable shielding, the GPIO may be coupled to the pull-up resistor. After a predetermined settling time (e.g., based on the resistance of the pull-up resistor and the flex cable shielding capacitance), the voltage applied to the GPIO is detected. If the voltage is low (e.g., approximately ground), then the flex cable shielding does not appear to have any complete breaks (e.g., test pass). However, if the voltage is high (e.g., approximately the voltage applied to the pull-up resistor), then the flex cable shielding appears to have a complete break (e.g., test failure).

In another embodiment, the first pin may be coupled to ground. Furthermore, the second pin may be coupled to a general purpose input/output (GPIO) of the electronic device 10 that is configured as an input. During normal operation, the GPIO is not coupled to a pull-down resistor. However, when the electronic device 10 performs a test of the flex cable shielding, the GPIO may be coupled to the pull-down resistor. After a predetermined settling time (e.g., based on the resistance of the pull-up resistor and the flex cable shielding capacitance), the voltage applied to the GPIO is detected. If the voltage is high, then the flex cable shielding does not appear to have any complete breaks (e.g., test pass). However, if the voltage is low (e.g., approximately ground), then the flex cable shielding appears to have a complete break (e.g., test failure).

Figure 15:
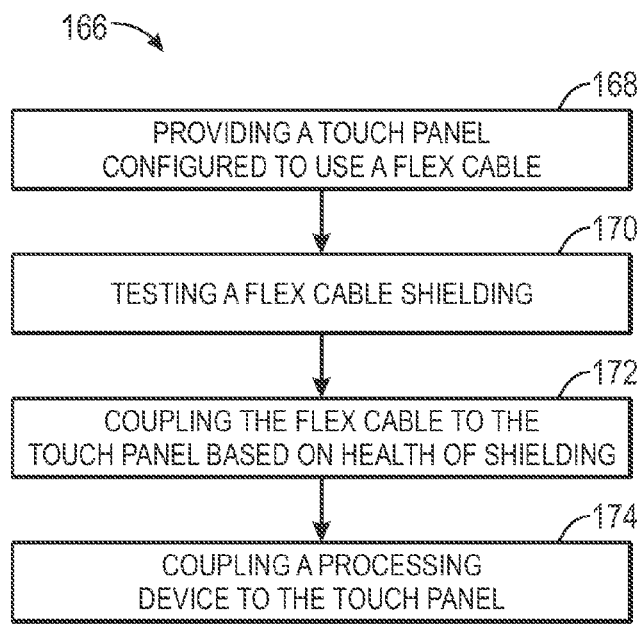
FIG. 15 is a flowchart describing a method for manufacturing a consumer electronic device having a flex cable with flex cable shielding, in accordance with an embodiment.

A consumer electronic device 10 may be manufactured with the flex cable 74 tested using one of the methods described herein. For example, FIG. 15 is a flowchart describing a method 166 for manufacturing the consumer electronic device 10 having the flex cable 74 with flex cable shielding. A touch panel (or other display device 18) configured to use the flex cable 74 may be provided (block 168). Flex cable shielding of the flex cable 74 may be tested (block 170). The flex cable shielding may be tested by applying a signal across a first portion of the flex cable shielding and a second portion of the flex cable shielding, detecting a parameter associated with the signal, and determining a health of the flex cable shielding based at least partially on the detected parameter. The flex cable may be coupled to the touch panel based at least partially on the determined health of the flex cable shielding (block 172). In certain embodiments, the flex cable may be coupled to the touch panel if no breaks are detected in the flex cable shielding. Further, a processing device 12 may be coupled to the touch panel (block 174).

Figure 16:
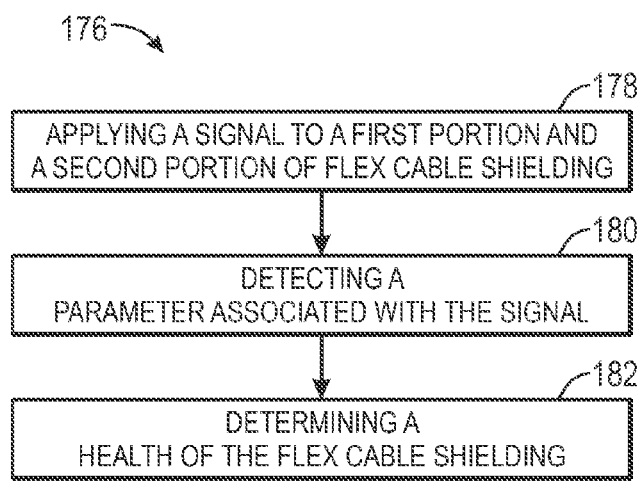
FIG. 16 is a flowchart describing a method for testing flex cable shielding of a flex cable, in accordance with an embodiment.

The flex cable 74 may be tested in a variety of testing methods. FIG. 16 is a flowchart describing one method 176 for testing flex cable shielding of the flex cable 74. The flex cable shielding may be tested by applying a signal (e.g., a fixed current, a fixed voltage) across a first portion of the flex cable shielding and a second portion of the flex cable shielding (block 178). In certain embodiments, the signal may be applied by a test instrument coupled to the first portion of the flex cable shielding and the second portion of the flex cable shielding. A parameter (e.g., a resistance, a current, a voltage, a short, an open, etc.) associated with the signal may be detected (block 180). In certain embodiments, a location of a defect in the flex cable shielding may be detected based at least partially on the detected parameter. A health of the flex cable shielding (e.g., whether complete breaks or partial breaks exist in the flex cable shielding) may be determined based at least partially on the detected parameter (block 182). For example, the method 176 may be configured to apply a fixed current and detect a resistance associated with the fixed current signal applied. In certain embodiments, a detected resistance of greater than 100 ohms may be considered an open circuit or a test failure.

Certain testing methods may include bending the flex cable 74 between test measurements. For example, one or more resistance values of the flex cable shielding may be detected. Following the resistance detection, the flex cable 74 may be bent (e.g., using a mandrel). In certain embodiments, the flex cable 74 may be bent more than once after detecting the one or more resistance values (e.g., 1, 2, 4, 5, 10 bends, or more). After the one or more bends, one or more resistance values may again be detected. The testing may continue by alternating between detecting one or more resistance values and bending one or more times, as desired.

Technical effects of the present disclosure include, among other things, detection of partial breaks and/or complete breaks in flex cable shielding during manufacturing, assembly, and/or use. By detecting problems in the flex cable shielding, undesirable or catastrophic results may be limited or avoided. Accordingly, users of electronic devices including flex cables with flex cable shielding may experience a decrease in problems relating to breaks in flex cables. Furthermore, users of the electronic devices and/or service personnel may be alerted before a catastrophic display failure occurs.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A method performed by test circuitry for testing flex cable shielding of a consumer electronic device comprising:
   applying a signal across a first portion of the flex cable shielding and a second portion of the flex cable shielding, the first and second portions of the flex cable shielding on opposite sides of a flex cable;
   detecting a parameter associated with the signal; and
   determining whether a break exists in the flex cable shielding based at least partially on the detected parameter.

2. The method of claim 1, wherein applying the signal across the first portion of the flex cable shielding and the second portion of the flex cable shielding comprises applying the signal via a controller of the consumer electronic device.

3. The method of claim 1, wherein applying the signal across the first portion of the flex cable shielding and the second portion of the flex cable shielding comprises applying the signal across a first pin coupled to the first portion of the flex cable shielding and a second pin coupled to the second portion of the flex cable shielding.

4. The method of claim 1, wherein applying the signal across the first portion of the flex cable shielding and the second portion of the flex cable shielding comprises applying the signal across a first pin coupled to the first portion of the flex cable shielding and a grounded portion of the flex cable shielding.

5. The method of claim 1, wherein applying the signal across the first portion of the flex cable shielding and the second portion of the flex cable shielding comprises applying the signal across an exposed portion of the flex cable shielding and a grounded portion of the flex cable shielding.

6. The method of claim 1, wherein applying the signal across the first portion of the flex cable shielding and the second portion of the flex cable shielding comprises applying the signal across a first exposed portion of the flex cable shielding and a second exposed portion of the flex cable shielding.

7. The method of claim 1, wherein the applied signal comprises a fixed voltage signal.

8. The method of claim 7, wherein detecting the parameter associated with the signal comprises detecting a current of the signal flowing between the first portion of the flex cable shielding and the second portion of the flex cable shielding.

9. The method of claim 7, wherein detecting the parameter associated with the signal comprises detecting a short between the first portion of the flex cable shielding and the second portion of the flex cable shielding.

10. The method of claim 1, wherein the applied signal comprises a fixed current signal.

11. The method of claim 10, wherein detecting the parameter associated with the signal comprises detecting a voltage across the first portion of the flex cable shielding and the second portion of the flex cable shielding.

12. The method of claim 10, wherein detecting the parameter associated with the signal comprises detecting a resistance between the first portion of the flex cable shielding and the second portion of the flex cable shielding.

13. The method of claim 1, wherein determining whether a break exists in the flex cable shielding comprises determining whether a complete or partial break exists.

14. The method of claim 1, comprising coupling a test instrument to the first portion of the flex cable shielding and the second portion of the flex cable shielding to apply the signal across the first portion of the flex cable shielding and the second portion of the flex cable shielding.

15. The method of claim 1, comprising detecting a location of a defect in the flex cable shielding based at least partially on the detected parameter.

16. A consumer electronic device comprising:
a first component;
a second component;
a flex cable having a first end coupled to the first component and a second end coupled to the second component; and
a processing device coupled to the flex cable and capable of applying a signal across a first portion of a flex cable shielding and a second portion of the flex cable shielding wherein the first and second portions of the flex cable shielding are located on opposite sides of a flex cable, detecting a parameter associated with the signal, and determining a health of the flex cable shielding based at least partially on the detected parameter, wherein determining the health of the flex cable shielding includes determining whether a break exists in the flex cable shielding.

17. The consumer electronic device of claim 16, comprising a storage device configured to store the determined health of the flex cable shielding for performing diagnostics on the consumer electronic device.

18. The consumer electronic device of claim 16, comprising an interface device configured to transmit the determined health of the flex cable to an external diagnostics device.

19. The consumer electronic device of claim 16, wherein the processing device is configured to determine the health of the flex cable shielding at specific intervals.

20. The consumer electronic device of claim 19, wherein the processing device is configured to determine the health of the flex cable shielding during a power on sequence.

21. The consumer electronic device of claim 19, wherein the processing device is configured to determine the health of the flex cable shielding during a power off sequence.

22. The consumer electronic device of claim 19, wherein the processing device is configured to determine the health of the flex cable shielding after a hard reset.

23. A method of manufacturing a consumer electronic device comprising:
providing a touch panel configured to use a flex cable;
testing a flex cable shielding by performing the following:
applying a signal across a first portion of the flex cable shielding and a second portion of the flex cable shielding, the first and second portions of the flex cable shielding on opposite sides of a flex cable;
detecting a parameter associated with the signal; and
determining a health of the flex cable shielding based at least partially on the detected parameter, wherein determining the health of the flex cable shielding includes determining whether a break exists in the flex cable shielding;
coupling the flex cable to the touch panel based at least partially on the determined health of the flex cable shielding; and
coupling a processing device to the touch panel.

24. The method of manufacturing of claim 23, wherein coupling the flex cable to the touch panel based at least partially on the determined health of the flex cable shielding comprises coupling the flex cable to the touch panel if no breaks are detected in the flex cable shielding.

* * * * *